United States Patent [19]

Okada et al.

[11] Patent Number: 4,691,178

[45] Date of Patent: Sep. 1, 1987

[54] ULTRASONIC DELAY LINE

[75] Inventors: Takeshi Okada; Haruto Hashimoto; Michihiko Uemura, all of Yokohama, Japan

[73] Assignee: Asahi Glass Company Ltd., Tokyo, Japan

[21] Appl. No.: 854,930

[22] Filed: Apr. 23, 1986

[30] Foreign Application Priority Data

Apr. 23, 1985 [JP] Japan ................................. 60-85457

[51] Int. Cl.$^4$ ............................................. H03H 9/36
[52] U.S. Cl. .................................... 333/143; 333/141; 333/147
[58] Field of Search ................................ 333/138–140, 333/141–149, 186–187

[56] References Cited

U.S. PATENT DOCUMENTS 3,254,317 5/1966 Bauer .................................. 350/96.1
3,798,577 3/1974 Kasahara et al. ................... 333/143
4,074,213 2/1978 Epsztein et al. ................. 333/148 X

OTHER PUBLICATIONS

IEEE Transactions on Sonics and Ultrasonics, vol. SU-31, No. 6, Nov. 1984, pp. 26–42; J. E. May: "Characteristics of Ultrasonic Delay Lines Using Quartz and Barium Titanate . . . ".

Primary Examiner—Marvin L. Nussbaum
Attorney, Agent, or Firm—Oblon, Fisher, Spivak, McClelland, & Maier

[57] ABSTRACT

An ultrasonic delay line including an input transducer for producing a sound wave depending on an input voltage, a delay medium for transmitting the sound wave produced by the input transducer and an output transducer for receiving the sound wave transmitted in the delay medium has a shape such that sound waves transmitted in the delay medium are misdirected with respect to the output transducer by a predetermined amount. As a result, a substantial part of a main signal is input into the output transducer, whereas a substantial part of the sound waves having the third or higher harmonic component with respect to the main signal misses the output transducer due to the higher directivity of these higher frequency components in the delay medium.

10 Claims, 4 Drawing Figures

ULTRASONIC DELAY LINE

BACKGROUND OF THE INVENITON

1. Field of the Invention

The present invention relates to an ultrasonic delay line in which electric signals are translated into sound waves and the translated sound waves are transmitted in a delay medium so that the electric signals are delayed.

2. Discussion of Background

The ultrasonic delay line constructed as above-mentioned has widely been used as an element for the circuit of a TV receiver, a video tape recorder (VTR), a video camera and so on.

In such ultrasonic delay line, there are main sound waves transmitted through a desired path in the delay medium and other sound waves transmitted through paths other than the desired path. Accordingly, when the other sound waves are picked up as spurious signals by an output transducer, an image reproduced, for example by the VTR, may be adversely affected.

To avoid this problem, there has been proposed a method of attenuating the spurious sound waves by attaching at least one absorbing material onto the main surface of the delay medium in parallel to the transmitting direction of the sound waves and side surfaces perpendicular to the main surface, or by roughening the main surface and the side surfaces.

Also, there has been proposed a method of attenuating $2\tau$ and $3\tau$ spurious signals by providing at least one absorbing material in the desired path, as shown in commonly owned Japanese Examined Patent Publication No. 19942/1977. The $2\tau$ spurious signal is a sound wave that is returned to the input transducer through the desired path after it has been once picked up by the output transducer; hence the delay time of the sound wave is twice the desired delay time $\tau$. The $3\tau$ spurious signal is such a sound wave that the $2\tau$ spurious signal is again transmitted through the desired path to be picked up by the output transducer.

In the above-mentioned conventional spurious sound wave attenuating methods, an attempt has been made only to remove the fundamental frequency component of a sound wave (hereinbelow, referred to as the main signal) transmitted in the delay medium. Namely, measures have been taken to remove the fundamental frequency component of the spurious signals transmitted through paths other than the desired path and the fundamental frequency component of the $2\tau$ and $3\tau$ spurious signals transmitted through the desired path.

However, sound wave signals transmitted in the delay medium generally have harmonic components. For instance, a frequency characteristics diagram of FIG. 2 shows superposition of a spurious signal having the third harmonic component which has a frequency $f_3$ (exemplified as frequencies from 13 MHz to 16 MHz in FIG. 2) three or four times higher than the center frequency $f_0$ (exemplified as 4.3 MHz in FIG. 2) of a main signal pass band. When the spurious signal having such harmonic component is of a fairly high level (for example, a level 20 dB lower than the main signal level in FIG. 2) and is superposed on the main signal, and if a video camera is used under this condition, stripe-like noise appear in a reproduced image thereby adversely affecting image reproduction.

SUMMARY OF THE INVENTION

It is an object of the present invention to eliminate the disadvantage of the conventional ultrasonic delay line and to provide a new and improved ultrasonic delay line capable of suppressing production of spurious signals having the third or higher harmonic components.

The foregoing and the other objects of the present invention have been attained by providing an ultrasonic delay line comprising an input transducer for producing a sound wave depending on an input voltage, a delay medium for transmitting the sound wave produced by the input transducer, and an output transducer for receiving the sound wave trasmitted in the delay medium to produce an output voltage, wherein the delay medium has a shape such that sound waves transmitted in the delay medium are misdirected with respect to the output transducer by a predetermined amount. As a result a substantial part of a main signal is input into the output transducer and a substantial part of the sound waves having the third harmonic or higher component with respect to the main signal misses the output transducer due to the higher directivity of the higher frequency components in the delay medium.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
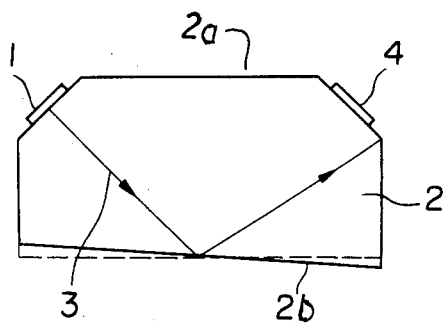
FIG. 1 is a front view of an embodiment of the ultrasonic delay line according to the present invention.

Referring now to the drawings, wherein like reference numerals designate identical or corresponding parts throughout the several views, and more particularly to FIG. 1 thereof, there is shown a front view of a typical example of the ultrasonic delay line of the present invention. In FIG. 1, a delay medium 2 has such a shape that two opposed upper corner portions of an upper surface 2a of a rectangular prism are cut at an angle of about 45° and the lower or bottom surface 2b is slanted at a predetermined angle with respect to the upper surface. On the cut corner surfaces, an input transducer 1 and an output transducer 4 each provided with an electrode (not shown) are respectively attached. A sound wave 3 emitted in the delay medium 2 from the input transducer 1 is subjected to mirror reflection by the bottom surface 2b of the delay medium 2 and is transmitted to a mounting surface on which the output transducer 4 is mounted.

In this embodiment, the delay medium 2 has the bottom reflecting surface 2b inclined from an imaginary surface indicated by a broken line by which a sound wave reaches the output transducer 4, so that sound waves having the third harmonic component or higher of the sound wave 3 which has been subjected to mirror reflection in the reflecting surface 2b do not reach the output transducer 4. When the inclination angle of the reflecting surface 2b is too small with respect to the imaginary surface indicated by the broken line, components of the sound wave 3 having the third harmonic wave or higher reach the output transducer 4. On the other hand, when the inclination angle is too large, sufficient detection of the main signal component of the sound wave 3 by the output transducer 4 cannot be obtained although the main signal component is transmitted under diffusion in the delay medium 2. Accordingly, it is preferable that the inclination angle be in the range from 0.1° to 4°.

Figure 3:
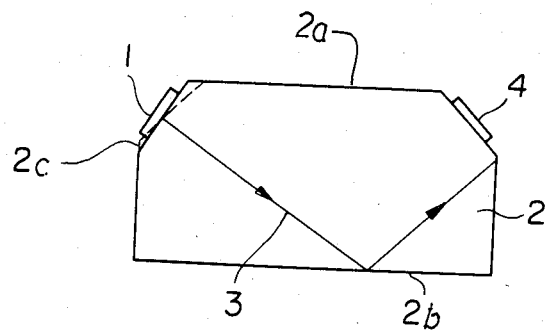
FIG. 3 is a front view of another embodiment of the ultrasonic delay line of the present invention.

As an alternative of the delay line as shown in FIG. 1, a delay line as shown in FIG. 3 may be utilized. In the delay medium 2 of this embodiment, one corner portion of the upper surface of a rectangular prism is cut at an angle of about 45°, and the other corner portion is cut at an angle other than 45°. For example, the input transducer 1 is attached to the surface cut at the angle other than 45°, and the output transducer 4 is attached to the surface cut at the angle of about 45°. The input and output transducer are respectively provided with an electrode (not shown). Namely, a mounting surface 2c for mounting the input transducer 1 is inclined from an imaginary surface at an angle of 45° C., as indicated by a broken line, by means of which the sound wave reaches the output transducer 4 so that components of the sound wave 3 having the third harmonic component or higher transmitted in the delay medium 2 from the input transducer 1 do not reach the output transducer 4, the sound wave components having been once subjected to mirror reflection in the reflecting surface 2b. In this case, the inclination angle of the mounting surface 2c is preferably in the range from 0.1° to 4°, similar to the embodiment in FIG. 1.

Figure 2:
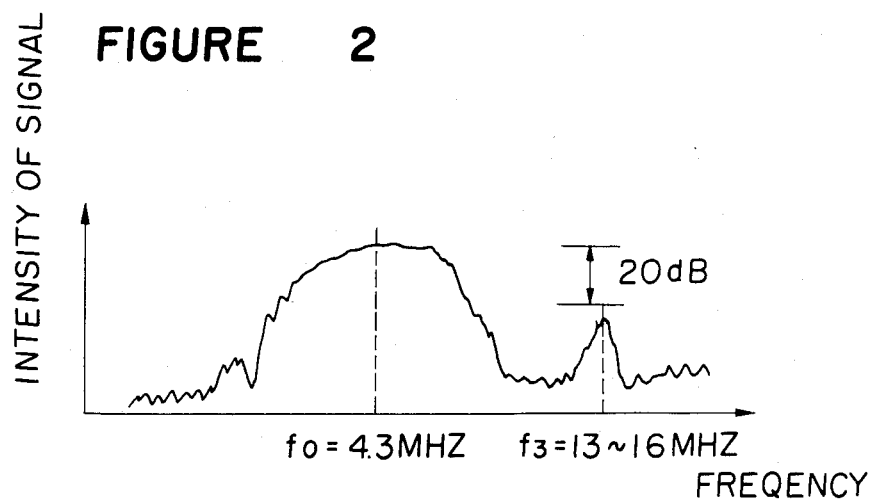
FIG. 2 is a diagram showing frequency characteristics of a conventional ultrasonic delay line.

In FIGS. 1 and 2, the delay medium 2 of a trapezoidal shape is used. However, the shape of the delay medium 2 need not be trapezoidal, but it may be of any desired shape, such as a pentagonal form. Namely, the delay medium 2 may have any shape as long as the main signal component of the sound wave transmitted in the delay medium gives a sufficient output voltage when it is picked up by the output transducer irrespective of its diffusion, and a substantial amount of the sound waves having the third harmonic component or higher does not reach the output transducer 4 while they go straight and are subjected to mirror reflection in the delay medium.

It is not always necessary that the input transducer 1 and the output transducer 4 are respectively attached to separate side surfaces. They may be attached to the same side surface.

The delay medium 2 is made of a material capable of transmitting sound waves, such as isotropic glass, ceramics, metal and so on.

For the input and output transducer 1, 4, a piezoelectric element such as lead zirconate titanate, quartz, lithium niobate and so on may be used. The piezoelectric element is attached to at least one side surface of the delay medium 2 by a bonding method using an adhesive agent or a soldering method.

According to the present invention, it is recognized that spurious sound waves having the third or higher harmonic components transmitted in the delay medium 2 have high frequencies and high directivity. Accordingly, according to the invention, the sound waves are misdirected in relation to the output transducer 4 by taking a course, for example, as shown in FIGS. 1 or 3, namely, the sound wave 3 goes straight in the delay medium 2 and is subjected to mirror reflection in the reflecting surface 2b. Accordingly, there is virtualy unaffected transmission and reception of the main signal component, but almost no spurious sound wave is picked up by the output transducer 4 due to the high directivity of the spurious sound waves.

Figure 4:
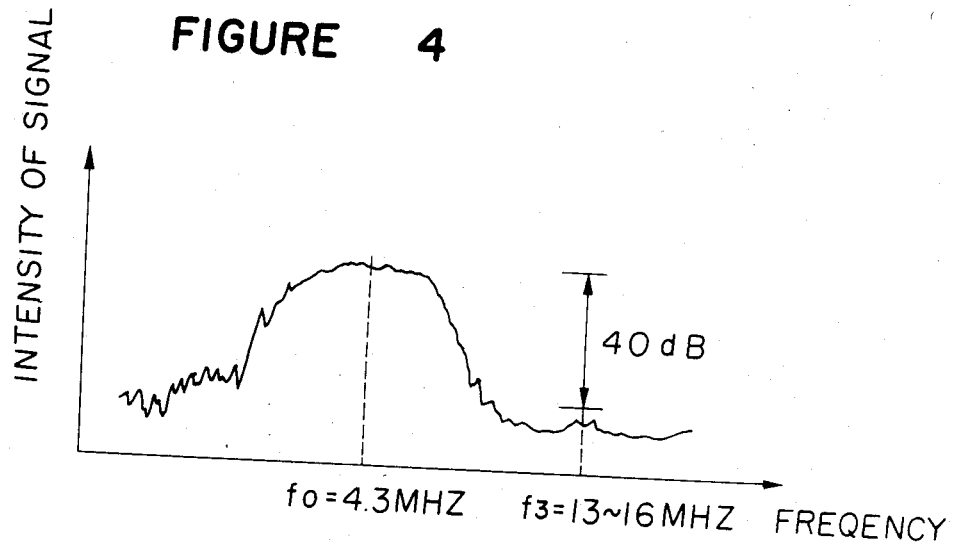
FIG. 4 is a diagram showing frequency characteristics of the ultrasonic delay line of the present invention.

On the other hand, as above indicated, the main signal component of the sound wave 3 has a lower frequency than the spurious sound waves having the third harmonic or higher component. Accordingly, the main signal component has a rate of diffusion greater than the spurious sound waves having the third or higher harmonic component. There is no substantial error in delay time and insertion loss is not large as long as the shape of the delay medium 2 is not extensively deformed, i.e., the misdirection of the signal path with respect to the output transducer is not too large. Therefore, the main signal component of the sound wave 3 can be picked up by the output transducer 4. Thus, only the spurious components of the sound waves having the third harmonic or high component is remarkably attenuated as shown in FIG. 4 without introducing additional attenuation of the main signal beyond the normal insertion loss.

(EXAMPLE)

A delay medium made of glass was finished in such a manner that the bottom surface of the delay medium has an inclination angle of 2° with respect to a position indicated by a broken line as shown in FIG. 1, to impart a generally trapezoidal form with an inclined bottom surface.

Pieces of lead zirconate titanate were attached by an adhesive agent to respective slanting corner surfaces of the delay medium having the trapezoidal form so as to provide an input transducer and an output tansducer respectively.

An electric signal having center frequency of the main signal of 4.3 MHz was input in the ultrasonic delay line prepared as above-mentioned. As a result, an output signal having excellent characteristic, i.e. the signal level of the third harmonic component being 40 dB smaller than the main signal level as shown in FIG. 4, was obtained.

As described above, in the ultrasonic delay line of the present invention, the delay medium is so formed that among various sound waves transmitted in the delay medium, sound waves having the third harmonic component or higher with respect to the main signal are not detected by the output transducer. Accordingly, it is possible that only spurious signal components having the third harmonic component or higher are remarkably attenuated without causing substantial attenuation of the main signal component. Accordingly, production of stripe-like noises are suppressed when the ultrasonic delay line of the present invention is used in a video camera and VTR, and an excellent reproduced image can be obtained.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. An ultrasonic delay line comprising:

an input transducer for producing sound waves depending on an input voltage;

a delay medium having at least one reflecting surface for transmitting said sound waves produced by said input transducer from said input transducer via said reflecting surface to a predetermined location; and an output transducer disposed adjacent said predetermined location for receiving a portion of said sound waves transmitted in said delay medium to produce an output voltage;

wherein said delay medium has a shape such that sound waves, including a main signal component and third or higher harmonic components, transmittted from said input transducer and through said delay medium via said reflecting surface are misdirected by a predetermined amount in relation to said output transducer such that a substantial portion of the main signal component is input into said output transducer and substantial portion of sound waves having the third or higher harmonic components with respect to said main signal do not reach said output transducer due to said main signal component having a rate of diffusion greater than that of said third or higher harmonic components.

2. An ultrasonic delay line according to claim 1, wherein said delay medium has said reflecting surface inclined at a predetermined angle such that a substantial portion of said sound waves having the third harmonic or higher components which are reflected by said inclined reflecting surface does not reach said output transducer.

3. An ultrasonic delay line according to claim 2, wherein said delay medium comprises a rectangular prism having two opposed corner portions of an upper surface cut at an angle of about 45°.

4. An ultrasonic delay line according to claim 3, wherein said delay medium comprises a lower surface which is slanted at an angle in the range of from 0.1° to 4° with respect to said upper surface having the opposed corner portions cut at said angle of about 45°.

5. An ultrasonic delay line according to claim 1, wherein said input transducer is mounted on a mounting surface at a predetermined inclination angle such that a substantial portion of said sound waves having the third or higher harmonic component does not reach said output transducer.

6. An ultrasonic delay line according to claim 5, wherein said delay medium comprises a rectangular prism having corner portions on which said input and output transducers are mounted, wherein one corner portion of an upper surface thereof is cut at an angle of about 45° and the other corner portion is cut at an angle other than 45°.

7. An ultrasonic delay line according to claim 6, wherein said one corner portion of the upper surface of said rectangular prism is cut at an angle of about 45° and the other corner portion is cut at an angle of from 45°±(0.1° to 4°).

8. An ultrasonic delay line according to claim 1, wherein said delay medium is made of glass.

9. An ultrasonic delay line according to claim 1, wherein said input and output transducers are respectively made of lithium niobate.

10. An ultrasonic delay line according to claim 1, wherein said input and output transducers are respectively made of lead zirconate titanate.

* * * * *

UNITED STATES PATENT AND TRADEMARK OFFICE
CERTIFICATE OF CORRECTION

PATENT NO. : 4,691,178

DATED : September 1, 1987

INVENTOR(S) : TAKESHI OKADA; HARUTO HASHIMATO; MICHIHIKO UEMURA

It is certified that error appears in the above-identified patent and that said Letters Patent is hereby corrected as shown below:

Column 1, line 4, correct the spelling of "Invention";

line 67, change "appear" to --appears--.

Column 2, line 14, correct the spelling of "transmitted".

Column 3, line 25, change "45°C" to --45°--.

Column 4, line 3, correct the spelling of "virtually";

line 22, change "is" to --are--.

Column 5, line 31, change "does not" to --do not--.

UNITED STATES PATENT AND TRADEMARK OFFICE
CERTIFICATE OF CORRECTION

PATENT NO. : 4,691,178

DATED : September 1, 1987

INVENTOR(S) : TAKESHI OKADA; HARUTO HASHIMOTO; MICHIHIKO UEMURA

It is certified that error appears in the above-identified patent and that said Letters Patent is hereby corrected as shown below:

Column 5, line 14, correct the spelling of "transmitted";

line 19, after "and" insert --a--.

Signed and Sealed this

Twenty-sixth Day of April, 1988

Attest:

DONALD J. QUIGG

*Attesting Officer*   *Commissioner of Patents and Trademarks*